United States Patent
Fumi

(12) 
(10) Patent No.: US 6,457,514 B1
(45) Date of Patent: *Oct. 1, 2002

(54) LIQUID COOLED DISSIPATOR FOR ELECTRONIC COMPONENTS EQUIPPED WITH SELECTIVELY ARRANGED DISSIPATION FINS

(75) Inventor: Eugenio Fumi, Orvieto (IT)

(73) Assignee: Itelco-S.p.A., Sferracavallo-Orvieto (IT)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 406 days.

(21) Appl. No.: 08/996,030

(22) Filed: Dec. 22, 1997

(30) Foreign Application Priority Data

Aug. 8, 1997  (IT) .......................... AN97A0048

(51) Int. Cl.⁷ ................................. H05K 7/20
(52) U.S. Cl. ...................... 165/80.4; 165/170; 361/699; 361/702
(58) Field of Search ................ 165/80.4, 170; 361/699, 702

(56) References Cited

U.S. PATENT DOCUMENTS

| | | | |
|---|---|---|---|
| 3,551,758 A | * 12/1970 | Feree | 165/80.4 X |
| 3,807,493 A | 4/1974 | Stewart | 165/105 |
| 4,268,850 A | * 5/1981 | Lazarek et al. | 165/80.4 X |
| 4,712,158 A | * 12/1987 | Kikuchi et al. | 361/702 X |
| 4,884,168 A | * 11/1989 | August et al. | 361/702 |
| 4,884,630 A | * 12/1989 | Nelson et al. | 165/170 |
| 5,099,311 A | * 3/1992 | Bonde et al. | 165/80.4 X |
| 5,111,280 A | * 5/1992 | Iversen | 165/80.4 |
| 5,453,911 A | * 9/1995 | Wolgemuth et al. | 361/689 |
| 5,666,269 A | * 9/1997 | Romaro et al. | 361/699 |
| 5,983,997 A | * 11/1999 | Hou | 165/144 |

FOREIGN PATENT DOCUMENTS

| | | |
|---|---|---|
| CH | 680179 A5 | 6/1992 |
| EP | 0342975 A2 | 11/1989 |
| EP | 0552538 A1 | 7/1993 |
| WO | WO 96/28005 A1 | 9/1996 |

* cited by examiner

*Primary Examiner*—Allen Flanigan

(57) ABSTRACT

This invention concerns a liquid cooled dissipator for electronic components characterized by selectively arranged dissipation fins, namely fins positioned only in proximity of the areas against which the electric components to cool are mounted.

8 Claims, 3 Drawing Sheets

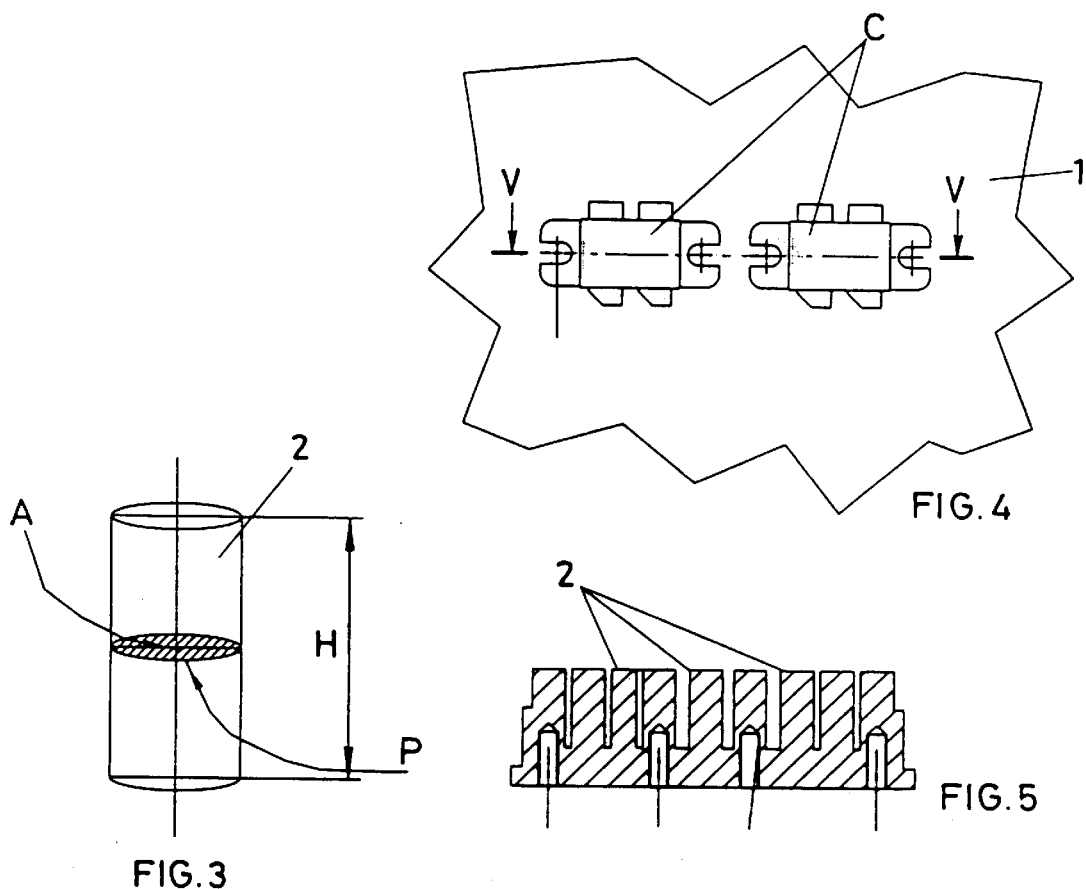
FIG. 4
FIG. 3
FIG. 5
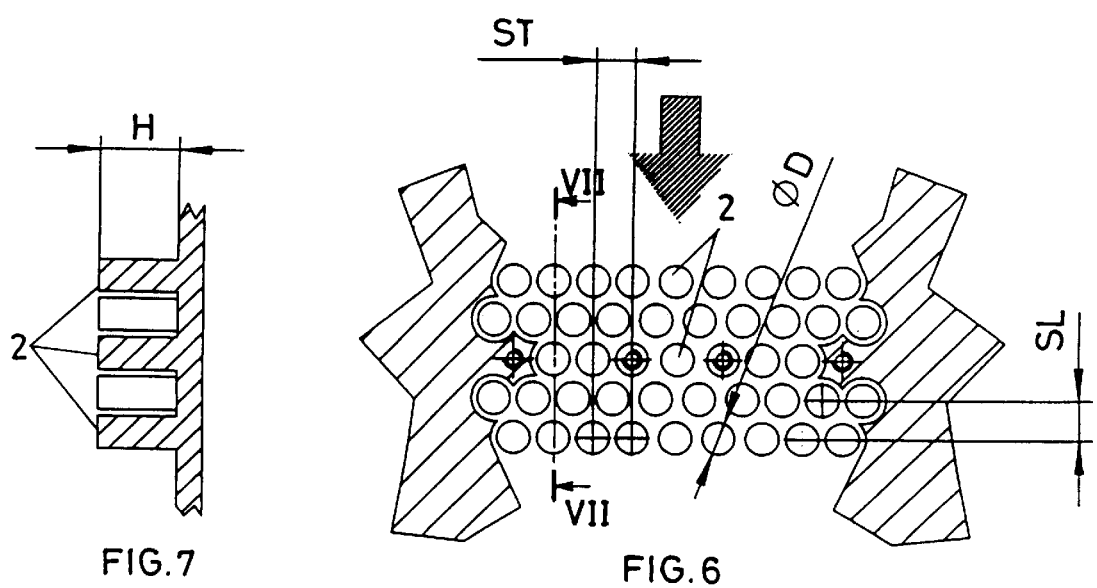
FIG. 7
FIG. 6

LIQUID COOLED DISSIPATOR FOR ELECTRONIC COMPONENTS EQUIPPED WITH SELECTIVELY ARRANGED DISSIPATION FINS

This invention concerns a liquid cooled dissipator having selectively arranged fins for electronic power components. It is common knowledge that all electronic components, especially power components, produce a considerable amount of heat during operation which must be dispersed in order to avoid compromising the proper operation of the same.

For some time heat dissipators have been available on the market on which the electronic components are fitted in order to considerably reduce their operating temperature.

The first class of dissipators is the so called air dissipator in which most of the heat is dispersed by the production of forced air.

It should be noted however that in the case of electronic components with particularly high operating temperatures, heat dissipators cooled by flows of high pressure refrigerated liquids have been designed.

In particular this last type of dissipator generally consists of a metal plate provided over the full extension of its internal face, with a closely fitting regular series of dissipation fins; this plate is sealed at the bottom by a hermetic lid which forms an internal sealed duct in which the cooling liquid circulates.

In this compartment of the dissipator—in which the above dissipation fins on the internal face of the plate are fitted—the forced circulation of the cooling liquid takes place.

This forced circulation cools the dissipating fins and by conduction also cools the entire surface of the supporting plate; considering therefore that the electronic components to cool are mounted externally to said finned plate, it is evident that cooling of the plate effectively ensures the required heat dissipation to the advantage of the electronic components.

Although these traditional liquid cooled dissipators are undoubtedly practical, it is possible to improve them from both an operational and structural point of view.

In particular, with reference to said traditional liquid dissipators, the dissipation fins on the internal face are too numerous.

It has been ascertained in fact that of the numerous fins on the internal face of a dissipator of this kind, those which ensure major heat dispersion are those positioned precisely at the points corresponding to the position of the electronic components to cool mounted outside the dissipator itself.

The fins arranged in the areas around those where the electronic components are mounted are not only negligible in terms of heat dispersion but also significantly hinder the load loss in terms of the forced circulation of the cooling liquid.

In particular, the significant resistance produced by this closely fitting and uniform series of fins has forced designers of traditional liquid dissipators to carefully develop the characteristics of the relevant water systems both in terms of dimensions and power absorption.

The liquid dissipator according to the invention has been designed taking into account this very problem.

It consists of a traditional structure composed of the finned plate closed at the bottom by means of the sealed lid but is also characterised by the use of dissipation fins arranged selectively, namely only at the points where the electronic components to cool are mounted on the external surface.

On one hand this solution eliminates most of the dissipation fins on the internal surface of this dissipator giving an obvious saving in terms of costs, structure and design without however compromising in any way the heat dispersion capacity of the dissipator itself.

On the other hand the liquid dissipator according to the invention makes it possible to realise in proximity of the finless areas, a number of preferential ducts for the circulation of the cooling liquid, which considerably reduce the resistance encountered by the liquid in the dissipator giving obvious design and technical-operational advantages.

Another important characteristic of the new dissipator in question is that the new finned plate is produced from a single block of metal processed by the removal of shavings with NC machines or moulded; the dissipation fins are produced from the full block by the removal of shavings.

Although this process implies long technical times it does however ensure considerable advantages: the first of which is the operational flexibility which translates above all into the possibility of varying at any time—simply by modifying the job programme of the NC machine—the number and position of fins and the shape of the cooling liquid ducts on the internal surface of the dissipator according to the invention.

The fact that the new dissipator according to the invention is produced from a single block of uniform material moreover permits obtaining a minimum thermal resistance in that the same is due exclusively to the arrangement and shape of the fins and the liquid flow, without mentioning the high interface thermal resistances when the dissipator is not obtained from a single block.

Thanks to the fact that the dissipator in question is designed from a single block, the surface on which the components to cool are mounted, is extremely flat with an excellent finish; this also gives an extremely important technical—operational advantage in that the components to cool are often fitted on a copper or aluminium plate which is in turn abutted directly against the dissipator in question and which transfers the thermal flow to the latter.

It is therefore evident that a better finish of the external surface of the dissipator leads to major adhesion between the copper or aluminium supporting plate of the electronic components and the dissipator itself.

The uniformity of the material of the new dissipator in question is also particularly important for the prevention of corrosion and electro-corrosion.

Another important characteristic of the dissipator according to the invention is the use of a special type of dissipation fins; the geometry and centre to centre distances, namely the two most important parameters to optimise the performance of the fins from a thermal and fluid mechanics point of view, have been carefully designed.

For major clarity the description of the invention continues with reference to the enclosed drawings which are intended for purposes of illustration and not in a limiting sense, where:

FIG. 3 is an isometric view of one of the dissipation fins;

FIG. 4 is a view of a section of the supporting plate on which the two electronic components are mounted;

FIG. 5 is a cross-section of FIG. 4 on plane V—V;

FIG. 6 is a view of a finned section of the dissipator in question;

FIG. 7 is a cross-section of FIG. 6 on plane VII—VII.

Figure 1:
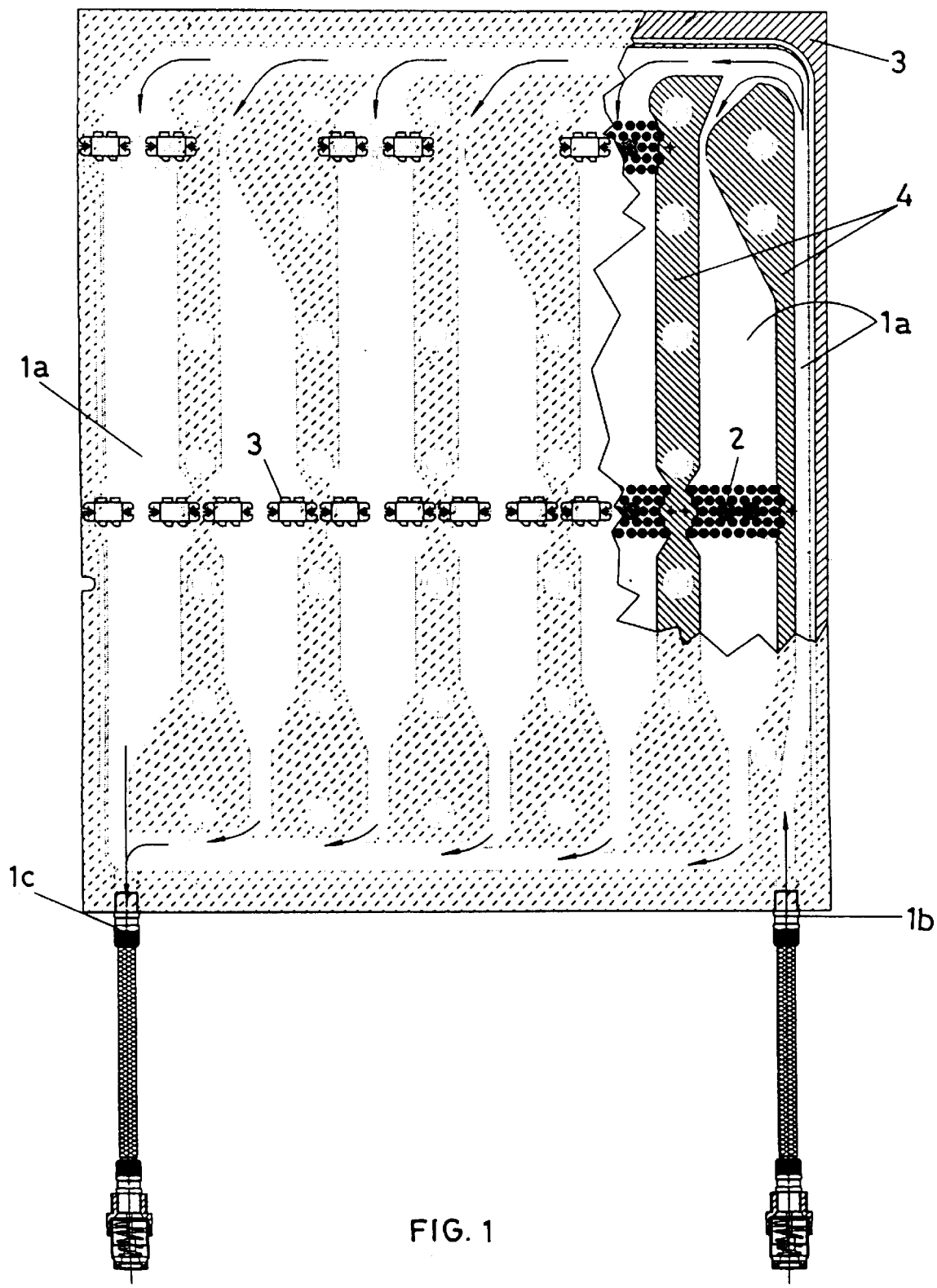
FIG. 1 illustrates the dissipator in question with a view of the side on which the components to cool are mounted; a part of the supporting plate is removed from the drawing in order to illustrate the internal structure of the dissipator.
Figure 2:
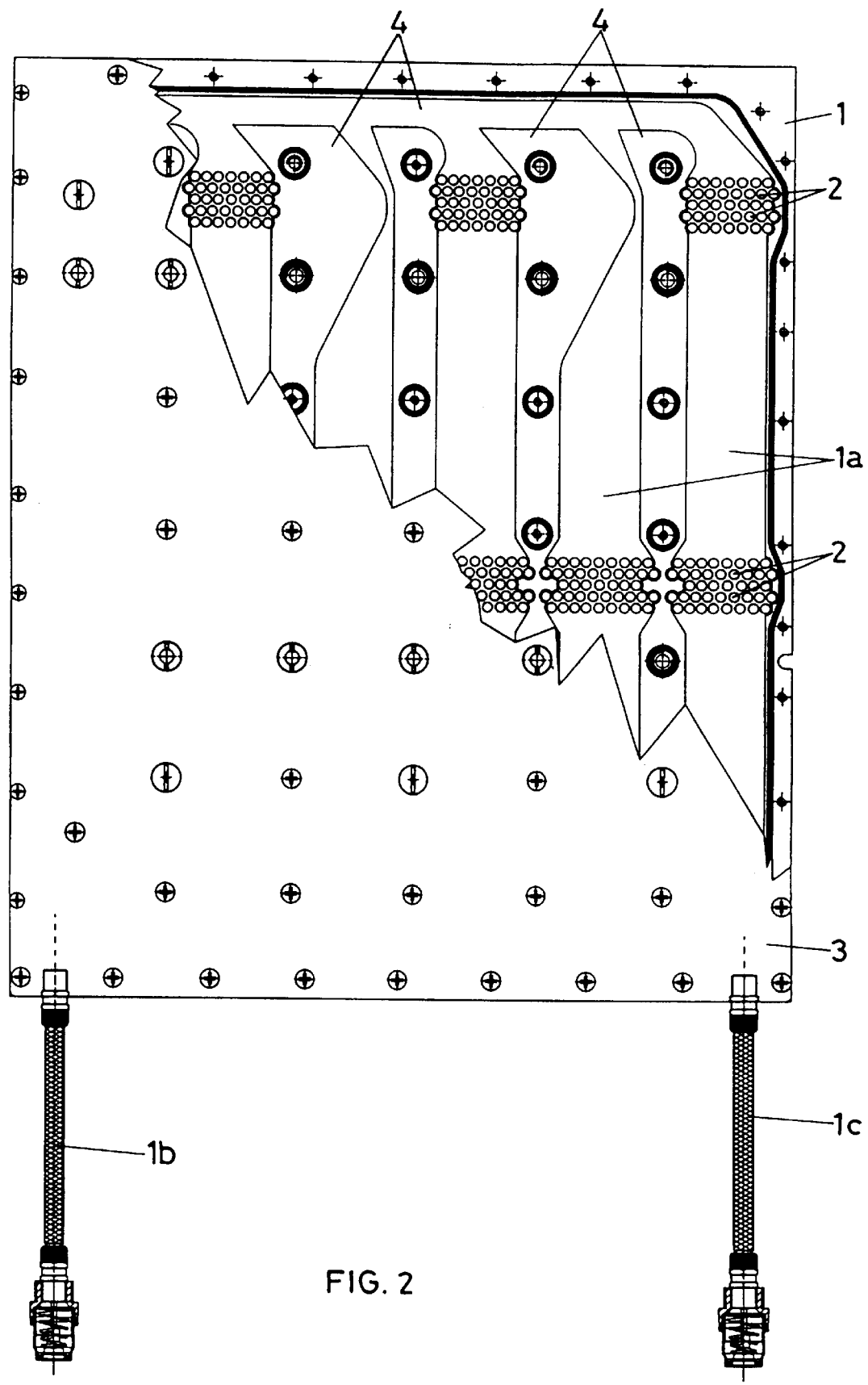
FIG. 2 illustrates the dissipator in question with a view of the opposite side; a part of the lid has also been removed from this drawing.

With reference to the above drawings, the dissipator in question consists of a metal plate (1) provided on its internal surface with a series of selectively arranged dissipation fins (2). The bottom of said plate (1) is sealed by means of a sealed lid (3) which—thanks to the presence of several longitudinal baffles (4)—creates a number of internal conducts or ducts (1a) in which the cooling liquid circulates.

In particular the cooling liquid circulating in said ducts (1a) flows into the dissipator in question through an inlet (1b) and flows out of the dissipator through an outlet (1c).

As mentioned previously, the characteristic of the dissipator according to the invention lies in the fact that the dissipation fins (2) are arranged in "bunches" on the internal surface of plate (1) only at the points where the electronic components (C) to cool are mounted on the external surface.

In other words, for each area on which the electronic components to cool are mounted, a corresponding finned area or finning is provided on plate (1) in which the fins (2) are provided in a number proportional to the thermal flow to eliminate.

Another important feature of the device in question is the particular configuration of each of the finned areas. With reference to FIGS. 1 and 6, each of these finned areas consists of a series of fins (2)—which are pins to all effects and purposes—staggered on several parallel rows having an orthogonal direction with respect to the ducting (1a).

With reference to FIGS. 4, 5, 6 and 7, it should be noted that:

letter A refers to the area of the average section, defined as the ratio between the volume of the pin (2) and the height (H) of the pin;

letter P refers to the perimeter of section A;

letter D refers to the corresponding diameter of the section A, defined as the ratio $3 \times A/P$;

letter H refers to the height of the pin (2);

code HD refers to the non dimensional height of the pin (2) defined as H/D;

code ST refers to the transverse pitch between the fins, measured in an orthogonal direction to that (indicated by arrow F) of the cooling liquid flow;

code SL refers to the longitudinal pitch between the fins measured in a direction parallel to that of the cooling liquid flow;

code STD refers to the transverse non dimensional pitch defined as the ratio ST/D;

code SLD refers to the longitudinal non dimensional pitch defined as ratio Sl/D.

The following table refers to the three non dimensional parameters, defined above, which indicates a field of optimal values for each in terms of the operation of the dissipator according to the invention;

1.50 HD 3.00
1.10 STD 2.00
1.08 SLD 2.50

Finally it is pointed out that the use of these preferential values for the three non dimensional parameters is valid and efficacious regardless of whether the pin (2) is circular or otherwise.

What is claimed is:

1. In a heat dissipator for electronic components, wherein a sealed housing has an inlet and further has an outlet for flow of a coolant through the housing between the inlet and the outlet thereof, and wherein the housing includes top and bottom walls joined by a side wall, the side wall comprising a metal plate having respective internal and external surfaces, the improvement wherein a plurality of electronic components are mounted only on portions of the external surface of the metal plate, other portions of the external surface being free of electronic components, a plurality of spaced-apart baffles disposed within the housing the baffles having respective upper and lower end portions which are spaced from the top and bottom walls of the housing, respectively, such that a first conduit for coolant flow is formed in the housing between the top wall of the housing and the respective upper end portions of the baffles, such that a second conduit for coolant flow is formed in the housing bottom wall of the housing between the baffles and the respective lower end portion of the baffles, such that the coolant from the inlet flows through the first conduit within the housing, transversely thereof, and adjacent to the top wall of the housing, then divides between the respective spaced-apart baffles, and such that the coolant flow between the spaced-apart baffles merges into the second conduit and exits from the outlet in the housing, and a plurality of clusters of radiating fins mounted on the internal surface of the metal plate, the radiating fins being disposed between respective adjacent pairs of spaced-apart baffles and substantially transversely of the coolant flow, the radiating fins further being disposed only substantially opposite to the electronic components mounted on the external surface of the metal plate, there being no fins located opposite those portions of the external surface which are free of electronic components.

2. The improvement of claim 1, wherein the radiating fins are arranged in rows, and wherein adjacent rows are staggered with respect to each other.

3. The improvement of claims 1, wherein each radiating fin comprises a pin.

4. The improvement of claim 3, wherein each pin has a height H and further has a diameter D, and wherein the ratio of the height to the diameter defined as H/D is in the range of 1.5 to 3.0.

5. The improvement of claim 3, wherein adjacent pins have a transverse pitch defined as ST and measured in a direction orthogonal to the direction of the coolant flow, wherein the ratio of the transverse pitch to the diameter-defined as ST/D is in the range of 1.1 to 2.0.

6. The improvement of claim 3, wherein adjacent pins have a longitudinal pitch defined as SL and measured in a direction parallel to the direction of the coolant flow, and wherein the ratio of the longitudinal pitch to the diameter defined as SL/D is in the range of 1.08 to 2.50.

7. The improvement of claim 1 wherein the fins, cooling liquid ducts metal plate are produced from a single block of metal.

8. In a heat dissipator for electronic components, wherein a sealed housing has an inlet and further has an outlet for flow of a coolant through the housing between the inlet and the outlet thereof, the improvement wherein the housing includes a metal plate having respective internal and external surfaces, a plurality of electronic components mounted only on portions of the external surface of the metal plate with the other portions of the external surface being free of electronic components, at least a pair of spaced-apart baffles mounted within the housing adjacent to the metal plate, such that a conduit is formed between the baffles for flow of the coolant, and a plurality of radiating pins mounted on the internal surface of the metal plate, the radiating pins being disposed in the conduit between the baffles and substantially transversely of the coolant flow, the radiating pins further being disposed only substantially opposite to the electronic components mounted on the external surface of the metal plate, there being no fins located opposite those portions of the external surface which are free of electronic components; wherein the radiating pins are arranged in rows, and wherein adjacent rows are staggered with respect to each other; wherein each radiating pin has a height H and further has a diameter D, and wherein the ratio of the height to the diameter defined as H/D is in the range of 1.5 to 3.0; wherein adjacent pins have a transverse pitch defined as ST and measured in a direction orthogonal to the direction of the coolant flow, wherein the ratio of the transverse pitch to the diameter defined as ST/D is in the range of 1.1 to 2.0; wherein adjacent pins have a longitudinal pitch defined as SL and measured in a direction parallel to the direction of the coolant flow, and wherein the ratio of the longitudinal pitch to the diameter defined as SL/D is in the range of 1.08 to 2.50.

* * * * *